(12) United States Patent
Seo et al.

(10) Patent No.: US 9,165,981 B2
(45) Date of Patent: Oct. 20, 2015

(54) ORGANIC LIGHT EMITTING DISPLAY AND METHOD OF MANUFACTURING THE SAME

(71) Applicant: Samsung Display Co., Ltd., Yongin (KR)

(72) Inventors: Ji-Hoon Seo, Yongin (KR); Kwan-Hee Lee, Yongin (KR); Ji-Hwan Yoon, Yongin (KR); Byung-Hoon Chun, Yongin (KR); Ja-Hyun Im, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/159,060

(22) Filed: Jan. 20, 2014

(65) Prior Publication Data

US 2014/0374707 A1     Dec. 25, 2014

(30) Foreign Application Priority Data

Jun. 25, 2013   (KR) .................. 10-2013-0073095

(51) Int. Cl.
*H01L 51/56* (2006.01)
*H01L 27/32* (2006.01)
*H01L 51/50* (2006.01)
*H01L 51/52* (2006.01)

(52) U.S. Cl.
CPC ............ *H01L 27/3211* (2013.01); *H01L 51/50* (2013.01); *H01L 51/5265* (2013.01); *H01L 51/56* (2013.01)

(58) Field of Classification Search
CPC . H01L 27/3206; H01L 27/3244; H01L 51/56; H01L 51/504

USPC ................................................ 257/40; 438/35
See application file for complete search history.

(56) References Cited

U.S. PATENT DOCUMENTS

| 2005/0184927 | A1* | 8/2005 | Kwak | 345/45 |
| 2012/0146041 | A1* | 6/2012 | Han et al. | 257/72 |
| 2013/0207085 | A1* | 8/2013 | Im et al. | 257/40 |

FOREIGN PATENT DOCUMENTS

| JP | 2011-082564 | 4/2011 |
| KR | 10-0424204 | 3/2004 |
| KR | 10-0650046 | 11/2006 |
| KR | 10-0669757 | 1/2007 |

* cited by examiner

*Primary Examiner* — Cathy N Lam
(74) *Attorney, Agent, or Firm* — H.C. Park & Associates, PLC

(57) ABSTRACT

An organic light emitting display includes a substrate; a first pixel electrode disposed on the substrate; a second pixel electrode disposed on the substrate; a hole auxiliary layer disposed on the first pixel electrode and the second pixel electrode; a first organic emission layer disposed on the hole auxiliary layer in correspondence with the first pixel electrode and the second pixel electrode; a blue organic emission layer disposed on the hole auxiliary layer in correspondence with the first pixel electrode and the second pixel electrode, the blue organic emission layer being further disposed on the first organic emission layer; a non-doping blue organic emission layer disposed on the blue organic emission layer; an electron auxiliary layer disposed on the non-doping blue organic emission layer; and a common electrode disposed on the electron auxiliary layer.

13 Claims, 6 Drawing Sheets

ORGANIC LIGHT EMITTING DISPLAY AND METHOD OF MANUFACTURING THE SAME

CROSS-REFERENCE TO RELATED APPLICATION

This application claims priority from and the benefit of Korean Patent Application No. 10-2013-0073095, filed on Jun. 25, 2013, which is incorporated by reference for all purposes as if set forth herein.

BACKGROUND

1. Field

Exemplary embodiments relate to display technology, and, more particularly, to organic light emitting displays and methods of manufacturing the same.

2. Discussion

Conventional organic light emitting devices typically include two electrodes and an organic emission layer disposed therebetween. One of the two electrodes injects holes and the other injects electrons into the organic emission layer. The injected electrons and holes are combined to form excitons that emit light as discharged energy. It is noted that the organic emission layer may be configured to emit the light in at least one range of wavelengths, such as, for example, red, green, and blue color wavelengths. To this end, various methods may be utilized to fabricate such organic emission layers, such as, for instance, laser induced thermal imaging and laser-induced sublimation transfer techniques.

Laser induced thermal imaging (LITI) is a laser addressed thermal patterning technique for exposing a mask pattern with a laser beam to generate a patterned laser beam that is irradiated onto a donor film including a base film and a transfer layer. Exposed regions of the transfer layer may be released from the transfer layer, and, thereby, adhered to a portion of the organic light emitting display to form an emission layer of the organic light emitting display. It is noted that LITI enables each emission layer to be precisely patterned and placed using a "dry" manufacturing process.

Blue organic emission layers, however, may be vulnerable to heat transfer, which typically occurs when a blue organic emission layer is irradiated with the patterned laser beam. As such, blue organic emission layer may be vacuum deposited on a larger surface than intended for the blue organic emission layer. That is, when forming an organic light emitting layer using LITI, a blue organic emission layer may be formed in association with other colored pixels, such as red pixels and green pixels, in addition to a blue colored pixel. This may be referred to as an organic light emitting display including a blue common layer (BCL) structure. It is noted, however, that the red organic emission layer and the green organic emission layer may require higher driving voltages due to the presence of the blue organic emission layer formed thereon. In this manner, luminous efficiency may be decreased and life-span may be deteriorated.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light emitting display including a blue common layer structure having relatively high luminous efficiency and improved life-span.

Exemplary embodiments provide a method of manufacturing the organic light emitting display including a blue common layer structure having relatively high luminous efficiency and improved life-span.

Exemplary embodiments provide a display device including a common layer structure having relatively high luminous efficiency and improved life-span.

Additional aspects will be set forth in the detailed description which follows and, in part, will be apparent from the disclosure, or may be learned by practice of the inventive concept.

According to exemplary embodiments, an organic light emitting display, includes: a substrate; a first pixel electrode disposed on the substrate; a second pixel electrode disposed on the substrate; a hole auxiliary layer disposed on the first electrode and the second pixel electrode; a first organic emission layer disposed on the hole auxiliary layer in correspondence with the first pixel electrode; a blue organic emission layer disposed on the hole auxiliary layer in correspondence with the first pixel electrode and the second pixel electrode, the blue organic emission layer being further disposed on the first organic emission layer; a non-doping blue organic emission layer disposed on the blue organic emission layer; an electron auxiliary layer disposed on the non-doping blue organic emission layer; and a common electrode disposed on the electron auxiliary layer.

According to exemplary embodiments, a method, includes: forming a first pixel electrode and a second pixel electrode on a substrate; forming a first organic emission layer on the first pixel electrode; forming a first blue organic emission layer on the first organic emission layer and the second pixel electrode; and forming a second blue organic emission layer on the first blue organic emission layer in correspondence with the first pixel electrode and the second pixel electrode. The second blue organic emission layer does not comprise a blue dopant.

According to exemplary embodiments, a display device, includes: a substrate; a first pixel electrode disposed on the substrate; a second pixel electrode disposed on the substrate; a first organic emission layer disposed on the first pixel electrode; a second organic emission layer disposed on the first organic emission layer and the second pixel electrode; and a third organic emission layer disposed on the first organic emission layer and the second organic emission layer, the third organic emission layer being non-doped.

According to exemplary embodiments, by forming the non-doping blue organic emission layer (which may simply include a blue host) between the blue organic emission layer (which may be disposed in association with each of a group of colored pixels and may include a blue host and a blue dopant) and the electron auxiliary layer, electrons of the electron auxiliary layer disposed on the non-doping blue organic emission layer may be smoothly injected into the blue organic emission layer. In this manner, a driving voltage may be reduced, which may, in turn, increase luminous efficiency and the life-span of an associated device, e.g., the life span of the organic light emitting display.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept and are incorporated in and constitute a part of this specification.

DETAILED DESCRIPTION OF THE ILLUSTRATED EMBODIMENTS

Figure 1:
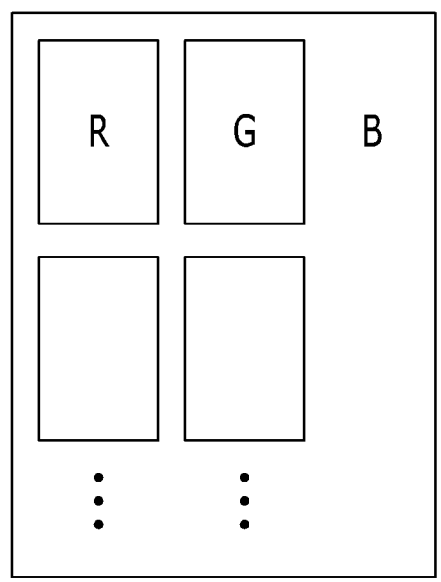
FIG. 1 is a schematic plan view of an arrangement of pixels in an organic light emitting display, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a schematic plan view of an arrangement of pixels in an organic light emitting display, according to exemplary embodiments.

Referring to FIG. 1, an organic light emitting display includes, for example, a red pixel R to display a red color, a green pixel G to display a green color, and a blue pixel B to display a blue color. It is contemplated, however, that additional and/or other suitable colors may be utilized, yellow, magenta, white, etc. As seen in FIG. 1, the set of red, green, and blue pixels R, G, and B may be utilized to display a larger range of colors, such as, for example, through the use of color dithering techniques or any other suitable methodology. In this manner, the red pixels R, the green pixels G, and the blue pixels B may be unit pixels of the organic light emitting display. As such, three pixels (e.g., a red pixel R, a green pixel G, and a blue pixel B) may form a group of pixels that are repeated in a first direction (e.g., a row direction) and a second direction (e.g., a column direction).

Regarding the arrangement of the red pixels R, the green pixels G, and the blue pixels B, a plurality of red pixels R, a plurality of green pixels G, and a plurality of blue pixels B may be alternately arranged in rows. The red pixel R, the green pixel G, and the blue pixel B may occupy substantially the same amount of surface area. It is contemplated, however, that any other suitable pixel arrangement may be utilized.

As seen in FIG. 1, a region corresponding to the blue pixel B encloses (or otherwise surrounds) the red pixel R and the green pixel G. In this manner, the blue organic emission layer may be formed on the whole surface that at least includes the red pixel R and the green pixel G, as well as the region of the blue pixel B. To this end, the organic light emitting display may be considered as including a blue common layer (BCL) structure. It is noted that the various pixels may have any suitable shape and/or arrangement. To this end, different colored pixels, such white pixels to display a white color, may be included.

Figure 2:
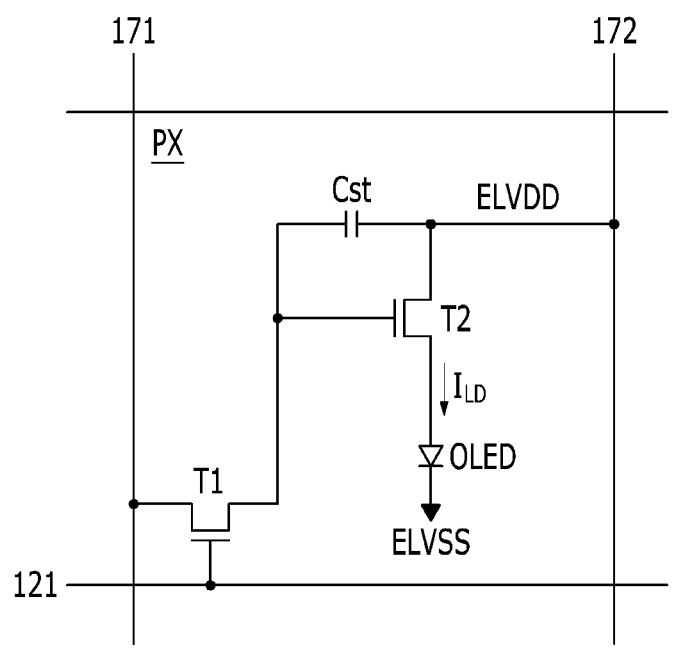
FIG. 2 is an equivalent circuit diagram of a pixel for an organic light emitting display, according to exemplary embodiments.

FIG. 2 is an equivalent circuit diagram of a pixel for an organic light emitting display, according to exemplary embodiments. It is noted that the pixels of the organic light emitting display may be substantially similar to one another sans differences in the color of light that may be emitted from a light emitting component (e.g., organic emission layer) of the pixels. As such, FIG. 2 may be considered a representative equivalent circuit diagram of a representative pixel PX.

Referring to FIG. 2, an organic light emitting display may include a plurality of signal lines 121, 171, and 172 and a plurality of pixels PX respectively connected thereto. In exemplary embodiments, the pixels PX may be arranged in any suitable manner, such as arranged in a matrix formation. To avoid obscuring exemplary embodiments described herein, an arrangement of pixels PX is not shown.

According to exemplary embodiments, the signal lines may include a plurality of scanning signal lines 121 to transmit gate signals (or scanning signals), a plurality of data lines 171 to transmit data signals, and a plurality of driving voltage lines 172 to transmit a driving voltage. The scanning signal lines 121 may longitudinally extend substantially in a first (e.g., row) direction and may be substantially parallel to each other. The data lines 171 and the driving voltage lines 172 may longitudinally extend substantially in a second (e.g., column) direction and may be substantially parallel to each other. Each pixel PX may include a switching transistor T1, a driving transistor T2, a storage capacitor Cst, and an organic light emitting diode (OLED). It is contemplated; however, that each pixel PX may include any suitable number and/or arrangement of transistors, capacitors, and/or one or more other components.

As seen in FIG. 2, the switching transistor T1 includes a control terminal, a first (e.g., input or source) terminal, and a second (e.g., output or drain) terminal. The control terminal is connected to the scan line 121, the input terminal may be connected to the data line 171, and the output terminal may be connected to the driving transistor T2. In this manner, the switching transistor T1 may transmit a data signal applied to the data line 171 to the driving transistor T2 in response to a scan signal applied to the scan line 121.

The driving transistor T2 includes a control terminal, a first (e.g., input or source) terminal, and a second (e.g., output or drain) terminal. The control terminal is connected to the switching transistor T1, the input terminal may be connected to the driving voltage line 172, and the output terminal may be connected to the organic light emitting diode OLED. In this manner, the driving transistor T2 may provide an output current $I_{LD}$ to the organic light emitting diode (OLED) in response to receiving a signal via the control terminal. It is noted that the magnitude of the output current may vary according to the voltage applied between the control terminal and the output terminal, e.g., a difference between a voltage of the data signal and a driving voltage ELVDD.

In exemplary embodiments, the storage capacitor Cst is connected between the control terminal and the input terminal of the driving transistor T2. The storage capacitor Cst may be configured to store the data signal applied to the control terminal of the driving transistor T2, as well as configured to maintain the stored data signal after the switching transistor T1 is "turned off."

The organic light emitting diode (OLED) includes a first terminal (e.g., an anode) connected to the output terminal of the driving transistor T2, a second terminal (e.g., a cathode) configured to receive a common voltage ELVSS, and an organic emission layer (not shown) disposed between the anode and the cathode. In this manner, the organic light emitting diode (OLED) may be configured to emit light based on reception of the output current $I_{LD}$. As such, the intensity of the light may vary according to the output current $I_{LD}$ of the driving transistor T2, which may be controlled to facilitate the display of at least one image.

According to exemplary embodiments, the switching transistor T1 and the driving transistor T2 may be any suitable switching element, such as an n-channel field effect transistor (FET), a p-channel FET, etc. Moreover, although the equivalent circuit diagram of pixel PX has been described in association with the illustration of FIG. 2, it is noted that the connection relationship of and/or between the switching transistor T1, the driving transistor T2, the storage capacitor Cst, and the organic light emitting diode (OLED) may be modified in any suitable manner. To this end, pixel PX may include any suitable number and/or arrangement of transistors, capacitors, and/or one or more other components.

Figure 3:
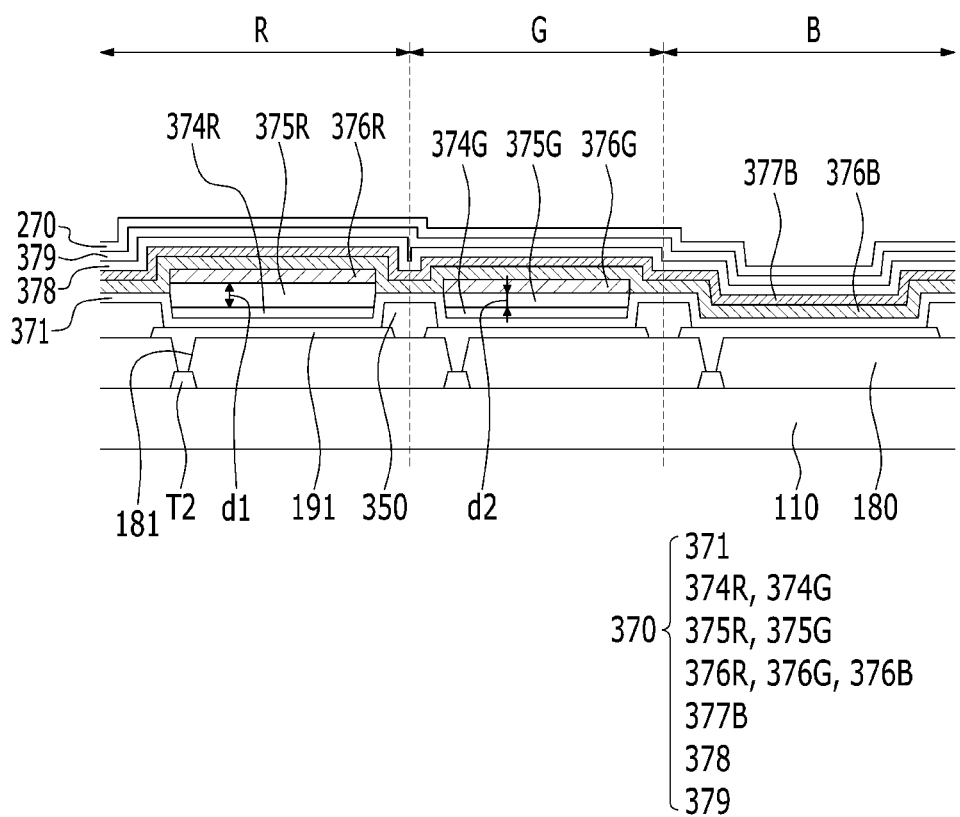
FIG. 3 is a cross-sectional view of three pixels of an organic light emitting display, according to exemplary embodiments.
Figure 4:
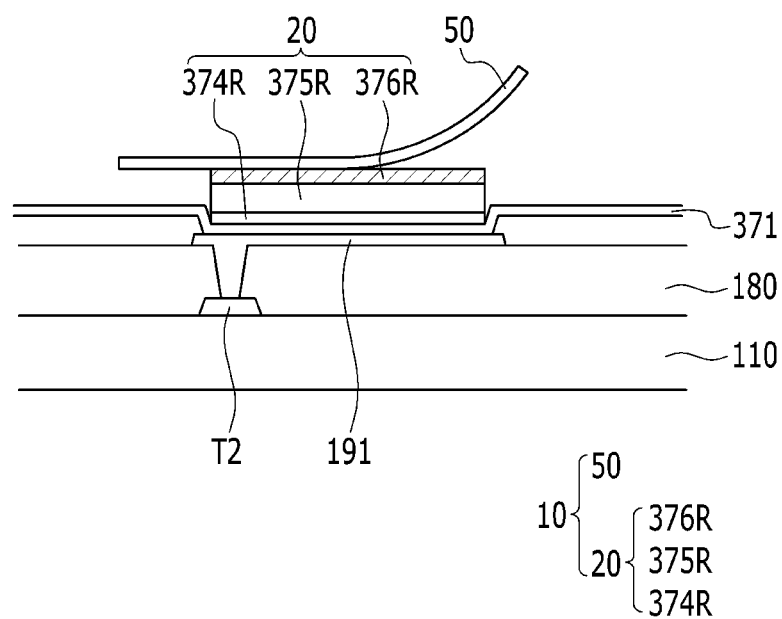
FIG. 4 is a cross-sectional view of a donor film being transferred onto a hole transport layer (HTL) of an organic light emitting display, according to exemplary embodiments.

FIG. 3 is a cross-sectional view of three pixels of an organic light emitting display, according to exemplary embodiments. For descriptive purposes, FIG. 3 is described in association with red, green, and blue pixels R, G, and B; however, it is contemplated that any suitable pixel colors may be utilized in association with exemplary embodiments described herein. FIG. 4 is a cross-sectional view of a donor film being transferred onto a hole transport layer (HTL) of an organic light emitting display, according to exemplary embodiments. For descriptive purposes, FIG. 4 is described in association with an HTL of a red pixel R; however, it is contemplated that the pixel may be a green pixel or any other suitable color pixel.

As shown in FIG. 3, a plurality of driving transistors T2 may be formed on an insulation substrate 110 made of any suitable material, such as, for example, transparent glass, plastic, etc. A plurality of signal lines (not shown) and a plurality of switching transistors (not shown) may be formed on the insulation substrate 110. To this end, a protective layer 180 made of, for instance, an inorganic material, an organic material, or an inorganic/organic composite material may be formed on the driving transistor T2. When, for instance, the protective layer 180 includes an organic material, a surface of the protective layer 180 may be planar (or substantially planar).

According to exemplary embodiments a pixel electrode 191 may be formed on the protective layer 180 in association with each of the pixels R, G, and B. That is, a red pixel electrode 191 may be formed in association with the red pixel R, a green pixel electrode may be formed in association with the green pixel G, and a blue pixel electrode may be formed in association with the blue pixel B. The pixel electrodes 191 may be made of any suitable material, such as, for instance, a transparent conductive oxide, e.g., aluminum zinc oxide (AZO), gallium zinc oxide (GZO), indium tin oxide (ITO), indium zinc oxide (IZO), etc. It is also contemplated that one or more conductive polymers (ICP) may be utilized, such as, for example, polyaniline, poly(3,4-ethylenedioxythiophene) poly(styrenesulfonate) (PEDOT:PSS), etc. It is noted that respective driving transistors T2 may be connected to corresponding pixel electrodes 191 through a contact hole (or via) 181 formed in the protective layer 180.

A reflective layer (not shown) to reflect light generated in the organic emission layer(s) may be formed between the protective layer 180 and the pixel electrode 191. The reflective layer may be made of any suitable reflective material, such as any suitable metal having high reflectance, such as, for example, silver (Ag), aluminum (Al), etc., and/or alloys thereof. It is also noted that a pixel definition layer 350 exposing the pixel electrode 191 and covering at least the edge of the pixel electrode 191 may be formed on the protective layer 180.

In the red, green, and blue pixels R, G, and B, a hole auxiliary layer 371 may be formed on the pixel electrode 191, such as formed on an entire (or substantially entire) surface of the pixel electrode 191. The hole auxiliary layer 371 may be formed as a single layer of a hole transport layer (HTL) material, or a multilayer (e.g., dual layer) of a hole injection layer (HIL) material and the hole transport layer (HTL) material.

According to exemplary embodiments, a red boundary layer 374R and a green boundary layer 374G may be respectively formed on the hole auxiliary layer 371 disposed in association with the red pixel (R) and the hole auxiliary layer 371 of the green pixel (G). A red resonance assistance layer 375R may be formed on the red boundary layer 374R, and a green resonance assistance layer 375G may be formed on the green boundary layer 374G. A first thickness d1 of the red resonance assistance layer 375G may be greater than a second thickness d2 of the green resonance assistance layer 375G. The red resonance assistance layer 375G and the green resonance assistance layer 375G may be configured to adjust a resonance distance associated with the respective colored pixels, e.g., the red pixel R and the green pixel G.

As seen in FIG. 3, a red organic emission layer 376R may be formed on the red resonance assistance layer 375G of the red pixel (R) and a green organic emission layer 376G may be formed on the green resonance assistance layer 375G of the green pixel (G). To this end, a blue organic emission layer 376B may be disposed on an entire (or substantially entire) surface associated with the red and green organic emission layers 376R and 376G and the hole transport layer (HTL) of the hole auxiliary layer 371 disposed in association with the blue pixel (B). The red organic emission layer 376R and the green organic emission layer 376G may be formed via laser induced thermal imaging, whereas the blue organic emission layer 376B may be formed via vacuum deposition. The red, green, and blue organic emission layers 376R, 376G, and 376B may be made of any suitable material, such as an organic material configured to emit light of red, green, and blue colors, respectively.

According to exemplary embodiments, the red boundary layer 374R, the red resonance assistance layer 375R, and the red organic emission layer 376R formed in association with a transferring layer 20 may be transferred to the organic light emitting display from a donor film 10. A transferring process will be described in more detail in association with FIG. 4. It is also noted that a transferring process of the green boundary layer 374G, the green resonance assistance layer 375G, and the green organic emission layer 376G is substantially similar as the transferring process of the red boundary layer 374R, the red resonance assistance layer 375R, and the red organic emission layer 376R. As such, duplicative descriptions are omitted to avoid obscuring exemplary embodiments described herein.

Adverting to FIG. 4, the donor film 10, which may be formed including the red organic emission layer 376R, may be disposed on the hole auxiliary layer 371 of the insulation substrate 110, which may be formed including the pixel electrode 191. The donor film 10 may include a base film 50 upon which the transferring layer 20 may be disposed. The base film 50 may be transparent, and, thereby, configured to transmit light to a heat converting layer (not shown). To this end, the base film 50 may be made of any suitable material having a photo-characteristic and mechanical stability to support the transfer process of the transferring layer 20.

Although not illustrated, the heat converting layer may be formed between the base film 50 and the transferring layer 20. The heat converting layer may be configured to absorb incident light of wavelengths in a region from infrared rays to visible rays. In this manner, the heat converting layer may convert a portion of the absorbed light into heat, and, thereby, may have an optical density and include a light absorption material to effectuate absorption of the incident light.

According to exemplary embodiments, the transferring layer 20 may be separated from the donor film 10 based on heat energy transmitted from the heat conversion layer. In this manner, the transferring layer 20 may be transferred to the substrate 110, which may include the hole transport layer (HTL) of the hole auxiliary layer 371. As such, the red organic emission layer 376R may be disposed on the red resonance assistance layer 375R, which may be disposed on the red boundary layer 374R that may, in turn, be disposed on the hole auxiliary layer 371 disposed in association with, for example, the red pixel R. It is noted that the red boundary layer 374R of the donor film 10 may be uniformly laminated onto the hole auxiliary layer 371. To this end, a laser beam (e.g., a patterned laser beam) may be radiated onto the donor film 10 disposed on the hole auxiliary layer 371 to effectuate the transfer of the transferring layer 20 onto the substrate 110.

In exemplary embodiments, by forming the red boundary layer 374G and the red resonance assistance layer 375R in association with the donor film 10 and transferring it onto the hole auxiliary layer 371 via the above-noted transmission process, thermal damage to the red resonance assistance layer 375R and the hole auxiliary layer 371 that may otherwise be caused, at least in part, by heat energy of the laser beam may be minimized (or at least reduced). To this end, one or more interface characteristics, such as a carrier transmitting ratio of a boundary surface of the red resonance assistance layer 375R and the hole auxiliary layer 371, may be improved. Also, since thermal damage of the red resonance assistance layer 375R and the hole auxiliary layer 371 is minimized (or at least reduced), an increase in the driving voltage may be prevented, which may, in turn, improve the reliability of the associated product, e.g., the organic light emitting display.

In a substantially similar manner, the green pixel G may be formed. That is, a donor film 10 including the green organic emission layer 376G disposed on the green resonance assistance layer 375G that is disposed on the green boundary layer 374G may be transferred onto the hole auxiliary layer 371 disposed in association with the green pixel G. In this manner, the insulation substrate 110 including the pixel electrode 191 may be formed including the green boundary layer 374G disposed on the hole auxiliary layer 371, the green resonance assistance layer 375G disposed on the green boundary layer 374G, and the green organic emission layer 376G disposed on the green resonance assistance layer 375G.

Adverting back to FIG. 3, a non-doping blue organic emission layer 377B may be formed on the blue organic emission layer 376B, which may be disposed on the hole transport layer (HTL) of the hole auxiliary layer 371 that may be disposed in association with each of the red, green, and blue pixels R, G, and B. As opposed to the blue organic emission layer 376B, which may include a blue host and a blue dopant in a determined ratio, the non-doping blue organic emission layer 377B may simply include the blue host. In this manner, electrons of the electron auxiliary layer (which is described in more detail in the proceeding paragraphs) that is disposed in association with the non-doping blue organic emission layer 377B may be smoothly inserted into the blue organic emission layer 376B through the non-doping blue organic emission layer 377B. As such, a driving voltage may be decreased, which may increase luminous efficiency and the life-span of the associated device, e.g., the organic light emitting display.

According to exemplary embodiments, the electron auxiliary layers 378 and 379 may be formed on the non-doping blue organic emission layer 377BIt is noted that the electron auxiliary layers 378 and 379 include an electron transport layer (ETL) 378 and an electron injection layer (EIL) 379 disposed on the ETL 378. The hole auxiliary layer 371, the ETL 378, and the EIL 379 may be configured to improve the luminous efficiency of the organic emission layers 376R, 376G, and 376B. To this end, the hole transport layer (HTL) of the hole auxiliary layer 371 and the ETL 378 may be configured to balance the electrons and the holes, whereas the hole injection layer (HIL) of the hole auxiliary layer 371 and the EIL 379 may be configured to reinforce the injection of the electrons and holes. In this manner, the hole injection layer (HIL) and the hole transport layer (HTL) of the hole auxiliary layer 371, the resonance assistance layers 375G and 375B, the organic emission layers 376R, 376G, and 376B, the non-doping blue organic emission layer 377B, the ETL 378, and the EIL 379 may form the organic light emitting member 370.

Figure 5:
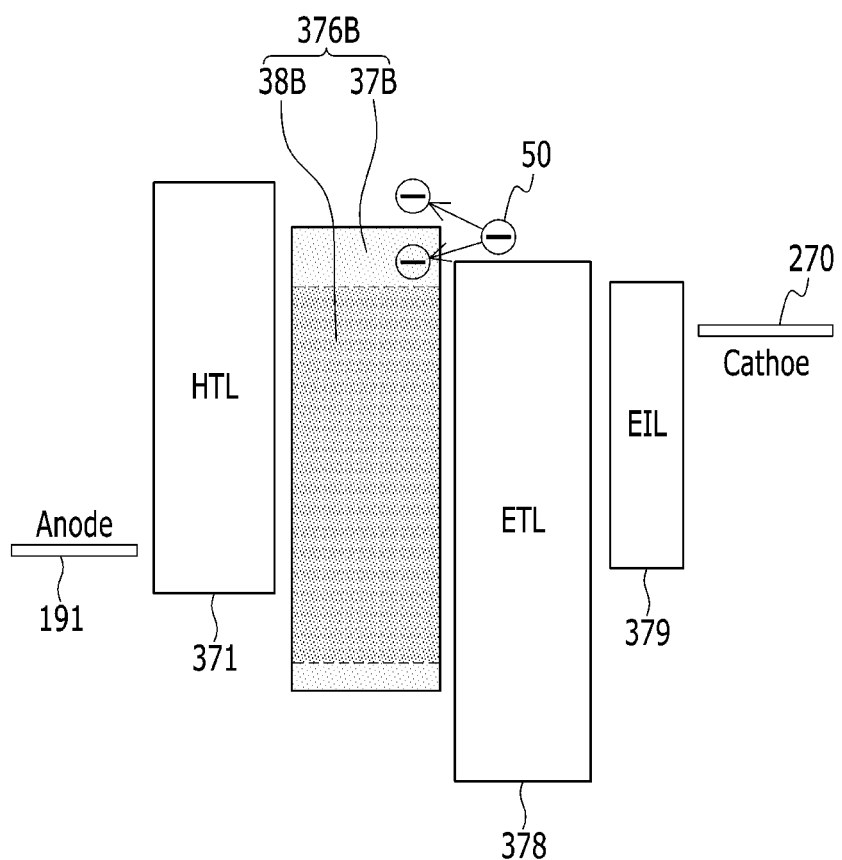
FIG. 5 is an energy level diagram of a blue common layer structure in a comparative organic light emitting display.
Figure 6:
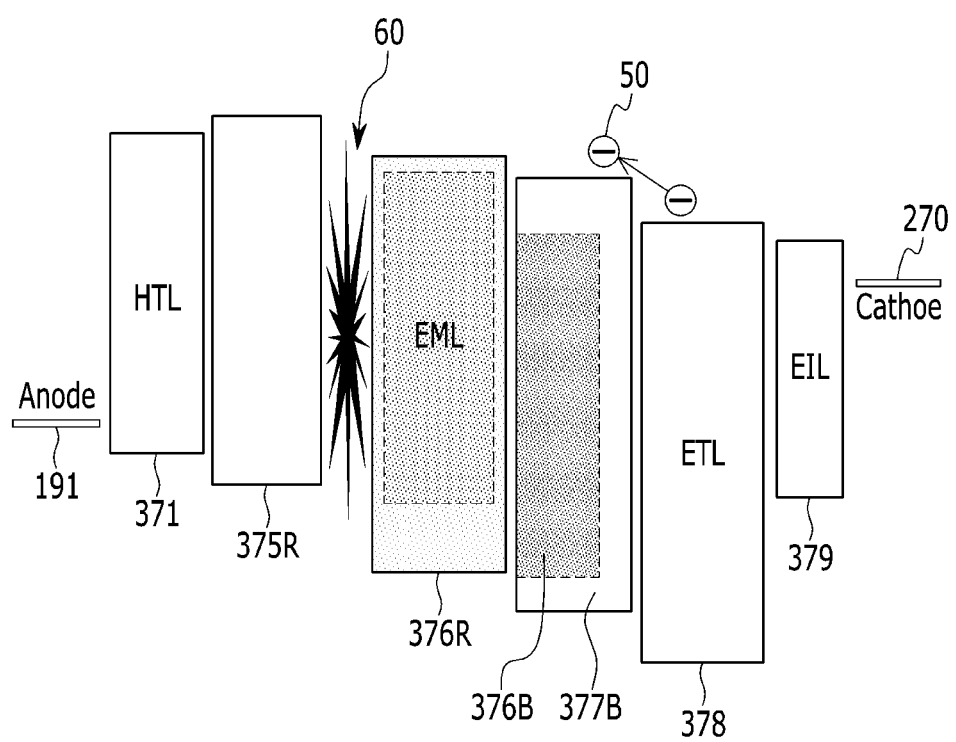
FIG. 6 is an energy level diagram of a blue common layer structure in an organic light emitting display, according to exemplary embodiments.

Operation of the non-doping blue organic emission layer of the organic light emitting display is described in more detail in association with FIGS. 5 and 6. FIG. 5 is an energy level diagram of a blue common layer structure in a comparative organic light emitting display. FIG. 6 is an energy level diagram of a blue common layer structure of an organic light emitting display, according to exemplary embodiments. For descriptive purposes, FIGS. 5 and 6 are described in association with a red pixel R.

In the blue common layer structure of the comparative organic light emitting display, since a blue dopant 38B is doped to an entire blue host 37B, as shown in FIG. 5, a path through which electrons 50 are injected from the ETL 378 to the blue organic emission layer 376B may have a first path from the ETL 378 to the blue host 37B and a second path from the ETL 378 to the blue dopant 38B. In this manner, however, since the blue dopant 38B traps (or otherwise seals) at least some of the electrons 50, the red organic emission layer 376R (not shown in FIG. 5) and the green organic emission layer 376G (not shown in FIG. 5) may have a relatively high driving voltage due to the blue organic emission layer 376B being formed thereon. As such, luminous efficiency may be decreased and life-span may be deteriorated.

As shown in FIG. 6, however, the blue common layer structure of the exemplary organic light emitting display includes the non-doping blue organic emission layer 377B that simply includes the blue host 37B (and, thereby, not the blue dopant 38B) between the blue organic emission layer 376B and the ETL 378. As such, the path through which the electrons 50 are injected from the ETL 378 to the blue organic emission layer 376B simply includes the first path from the electron transport layer ETL 378 to the blue host 37B. In this manner, electron trapping by the blue dopant 38B is eliminated (or at least reduced), such that the electrons 50 of the ETL 378 are smoothly injected into the blue organic emission layer 376B through the non-doping blue organic emission layer 377B.

According to exemplary embodiments, a light emitting phenomenon 60 caused, at least in part, by the recombination of holes and electrons may be occur at the boundary of the red resonance assistance layer 375R and the red organic emission layer 376R. To this end, the light emitting phenomenon 60 may not occur at the boundary of the ETL 378 and the blue organic emission layer 376B, such that the non-doping blue organic emission layer 377B (which does not include the blue dopant 38B) may be formed at the boundary of the ETL 378 and the blue organic emission layer 376B without issue.

Adverting back to FIGS. 2 and 3, a common electrode 270 to transmit a common voltage ELVSS may be formed on the EIL 379. The common electrode 270 may be formed in a multilayer (e.g., dual layer) structure including a first layer and a second layer disposed on the first layer. To this end, it is noted that the common electrode 270 may be configured to be transflective to permit incident light to be partially reflected and partially transmitted. Although the first and second layers of the common electrode 270 are not shown, each of the first and second layers may made of any suitable material, such as a reflective metal material. In this manner, the reflective metal material may be thinned to enable partial transmission of incident light and partial reflection of incident light. It is contemplated, however, that the common electrode 270 may be formed as a single layer.

According to exemplary embodiments, an encapsulation layer (not shown) may be formed on the common electrode 270. The encapsulation layer may encapsulate the organic light emitting member 370 and the common electrode 270. That is, the encapsulation layer may be configured to prevent penetration of moisture, oxygen, etc., from an ambient environment.

In exemplary embodiments, the pixel electrode 191, the organic light emitting member 370, and the common electrode 270 may be considered as forming an organic light emitting device (OLED). As such, the pixel electrode 191 may receive a voltage from the driving transistor T2 through the contact hole 181 of the protective layer 180. A common voltage ELVSS may be applied to the common electrode 270. As such, the organic light emitting member 370 may emit light toward the common electrode 270 based on a difference in voltages applied to the pixel electrode 191 and the common electrode 270. The light being emitting from the light emitting member 370 may be utilized to display an image.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light emitting display, comprising:
a substrate;
a first pixel electrode disposed on the substrate;
a second pixel electrode disposed on the substrate;
a hole auxiliary layer disposed on the first pixel electrode and the second pixel electrode;

a first organic emission layer disposed on the hole auxiliary layer in correspondence with the first pixel electrode;

a blue organic emission layer disposed on the hole auxiliary layer in correspondence with the first pixel electrode and the second pixel electrode, the blue organic emission layer being further disposed on the first organic emission layer;

a non-doping blue organic emission layer disposed on the blue organic emission layer;

an electron auxiliary layer disposed on the non-doping blue organic emission layer; and a common electrode disposed on the electron auxiliary layer.

2. The organic light emitting display of claim 1, wherein the non-doping blue organic emission layer is disposed in correspondence with the first pixel electrode and the second pixel electrode.

3. The organic light emitting display of claim 1, wherein the non-doping blue organic emission layer comprises a blue host.

4. The organic light emitting display of claim 1, wherein the blue organic emission layer comprises a blue host and a blue dopant.

5. The organic light emitting display of claim 1, further comprising:

a first boundary layer disposed on the first pixel electrode and between the hole auxiliary layer and the first organic emission layer; and a first resonance assistance layer disposed on the first boundary layer.

6. The organic light emitting display of claim 5, further comprising:

a third pixel electrode disposed on the substrate, the hole auxiliary layer being further disposed on the third pixel electrode; and a second organic emission layer disposed on the hole auxiliary layer in correspondence with the third pixel electrode, wherein the blue organic emission layer and the non-doping blue organic emission layer are further disposed in correspondence with the third pixel electrode and the second organic emission layer.

7. The organic light emitting display of claim 6, wherein:

the first pixel electrode, the second pixel electrode, and the third pixel electrode are disposed on the same layer; and the third pixel electrode is disposed between the first pixel electrode and the second pixel electrode.

8. The organic light emitting display of claim 7, wherein the first pixel electrode is disposed in association with a red pixel, the second pixel electrode is disposed in association with a blue pixel, and the third pixel electrode is disposed in association with a green pixel.

9. The organic light emitting display of claim 6, further comprising:

a second boundary layer disposed on the third pixel electrode and between the hole auxiliary layer and the third organic emission layer; and a second resonance assistance layer disposed on the second boundary layer.

10. The organic light emitting display of claim 9, wherein a thickness of the first resonance assistance layer is greater than a thickness of the second resonance assistance layer.

11. The organic light emitting display of claim 1, wherein the electron auxiliary layer comprises:

an electron transport layer disposed on the non-doping blue organic emission layer; and an electron injection layer disposed on the electron transport layer.

12. The organic light emitting display of claim 11, wherein the electron auxiliary layer and the common electrode are disposed in correspondence with the first pixel electrode and the second pixel electrode.

13. The organic light emitting display of claim 1, wherein the non-doping blue organic emission layer does not comprise a blue dopant.

* * * * *